United States Patent [19]

Hirai et al.

[11] 4,405,857
[45] Sep. 20, 1983

[54] SOLID-STATE PHOTOELECTRIC CONVERTER

[75] Inventors: Yutaka Hirai, Tokyo; Katsunori Hatanaka, Yokohama; Naoki Ayata, Machida; Shunichi Uzawa, Tokyo, all of Japan

[73] Assignee: Canon Kabushiki Kaisha, Tokyo, Japan

[21] Appl. No.: 246,290

[22] Filed: Mar. 23, 1981

[30] Foreign Application Priority Data

| Mar. 31, 1980 [JP] | Japan | 55-42203 |
|---|---|---|
| Mar. 31, 1980 [JP] | Japan | 55-42204 |
| Mar. 31, 1980 [JP] | Japan | 55-42205 |
| Mar. 31, 1980 [JP] | Japan | 55-42206 |

[51] Int. Cl.$^3$ .............................. H01J 40/14
[52] U.S. Cl. .................. 250/211 J; 250/578
[58] Field of Search ........... 250/209, 211 J, 578; 358/212, 213; 357/29, 30, 31, 32

[56] References Cited

U.S. PATENT DOCUMENTS

| 4,155,006 | 5/1979 | Sato et al. | 250/578 |
| 4,363,963 | 12/1982 | Ando | 357/30 |

Primary Examiner—David C. Nelms
Attorney, Agent, or Firm—Fitzpatrick, Cella, Harper & Scinto

[57] ABSTRACT

A photoelectric converter in solid-state assembly, comprising the following sections juxtaposed integrally on the same substrate: a photoelectric converting section constituted of a number of photoelectric converting elements arranged in an array, each element having a light-receiving surface for input of light-information; a charge accumulating section constituted of a number of accumulating means, each being provided for each of said photoelectric converting elements, for accumulation of charge signals photoelectrically converted by corresponding photoelectric converting elements; a transistor section for transfer constituted of a number of transistors for transfer, each being provided for each of said accumulating means, to perform a switching operation for transfer of the signals accumulated in corresponding accumulating means; and a BBD transfer section for outputting the signals transferred from each of said accumulating means by arrangement in time series thereof; said BBD section being constituted of a number of transistor and a number of capacitors; and said photoelectric converting elements, said transistors for transfer and the transistors constituting said BBD transfer section being constituted of thin semiconductor films.

12 Claims, 18 Drawing Figures

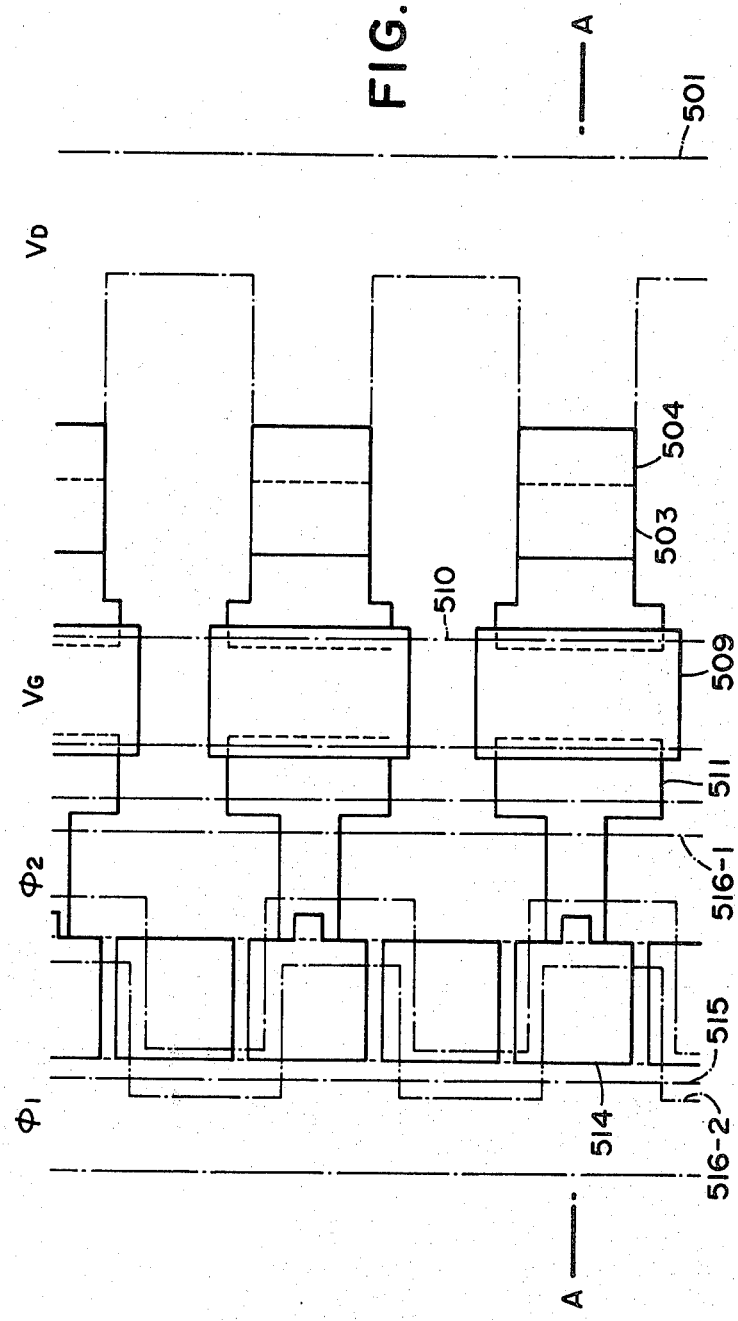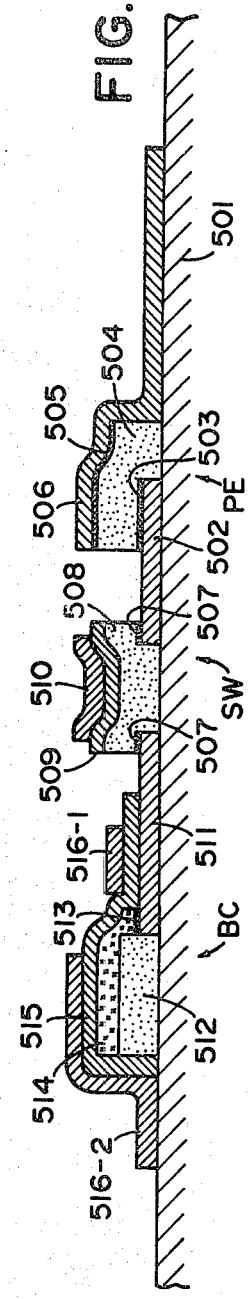

SOLID-STATE PHOTOELECTRIC CONVERTER

BACKGROUND OF THE INVENTION

1. Field of the Invention

This invention relates to a photoelectric converter, particularly to a solid-state photoelectic converter which can be applied for a light-information input section such as a facsimile, digital copier, laser recorder, etc. or for par-cord reading means or other means for reading letters, images, etc.

2. Description of the Prior Art

There have recently made remarkable developments in so called solid-state photoelectric converters to be applied for light-information input sections such as a facsimile, digital copier, laser recorder, etc., or for means for reading letters or images written on manuscripts. Such photoelectric converters, for the purpose of miniaturization of the assembly as a whole, tend to have so called elongated light-receiving surfaces of a size equal to or approximate to that of the original image. Such converters can be reproduced with excellent resolution, being capable of reading faithfully original images and can be compact.

The photoelectric converters as mentioned above, having elongated light-receiving surfaces involve are a great problem with respect to the signal processing circuit section which is equipped to the photoelectric converting section.

More specifically, the aforesaid signal processing circuit section will occupy an area space far greater than the photoelectric converting section, whereby it is not possible to enjoy fully the advantage of the miniaturization effected by extremely shortened optical path length of a light-information signal received as input to the light-receiving surface, which has been accomplished by elongation of the photoelectric converting section.

To speak of one method conventionally used for resolving this problem, there is generally adopted a system wherein the group of photoelectric converting elements (image elements) in the photoelectric converting section are divided into a plurality of blocks, each being wired in a matrix to provide the signal processing circuit section common to each block, which signal processing circuit section can thus be actuated by these block elements.

The problem encountered in the matrix wiring, as mentioned above, is that the number of bonding steps necessary for taking out the signals through connection between each photoelectric element and the signal processing section are extremely increased unless the group of photoelectric converting elements is integrated with the signal processing section.

In order to overcome this problem, such an integration is generally attempted by providing the signal processing circuit section on a crystalline silicon substrate and forming the photoelectric converting section thereon.

However, since the light-receiving surface of the photoelectric converting section is elongated, it is required that the signal processing section be located adjacent to the photoelectric converting section. With such a requirement, use of a crystalline silicon substrate presents a problem.

SUMMARY OF THE INVENTION

An object of the present invention is to improve the photoelectric converter of the prior art.

Another object of the present invention is to provide a solid-state assembled photoelectric converter having an elongated light-receiving surface, in which there is no deficient element present in a number of photoelectric converting elements constituting the photoelectric converting section.

Still another object of the present invention is to provide a solid-state assembled photoelectric converter, wherein there are juxtaposed on the same substrate the photoelectric converting section having an elongated light-receiving surface and the signal processing circuit section for processing the signals photoelectrically converted by said photoelectric converting section to produce outputs in time series.

It is also another object of the present invention to provide a photoelectric converter in solid-state assembly, comprising the following sections juxtaposed integrally on the same substrate;

a photoelectric converting section constituted of a number of photoelectric converting elements arranged in an array, each element having a light-receiving surface for input of light-information;

a charge accumulating section constituted of a number of accumulating means, each being provided for each of said photoelectric converting elements, for accumulation of charge signals photoelectrically converted by the corresponding photoelectric converting elements;

a transistor section for transfer constituted of a number of transistors for transfer, each being provided for each of said accumulating means, to perform switching operation for transfer of the signals accumulated in the corresponding accumulating means; and a BBD transfer section for outputting the signals transferred from each of said accumulating means by arrangement in time series thereof; said BBD section being constituted of a number of transistors and a number of capacitors; and said photoelectric converting elements, said transistors for transfer and the transistors constituting said BBD transfer section being constituted of thin semiconductor films.

It is still another object of the present invention is to provide a photoelectric converter in solid-state assembly, comprising the following sections juxtaposed integrally on the same substrate;

a photoelectric converting section constituted of a number of photoelectric converting elements arranged in an array, each element having a light-receiving surface for input of light-information;

a transistor section for transfer constituted of a number of transistors, each being provided for each of said photoelectric converting elements, to perform switching operation for transfer of charge signals photoelectrically converted by the corresponding photoelectric converting elements; and a BBD transfer section for outputting the signals transferred from each photoelectric converting element by arrangement in time series thereof; said BBD section being constituted of a number of transistors and a number of capacitors; and said photoelectric converting elements, said transistors for transfer and the transistors constituting said BBD transfer section being constituted of thin semiconductor films.

Further object of the present invention is to provide a photoelectric converter in solid-state assembly, comprising the following sections juxtaposed integrally on the same substrate;

a photoelectric converting section constituted of a number of photoelectric converting elements arranged in an array, each element having a light-receiving surface for input of light-information;

a diode section constituted of a number of diodes, each being provided for each of said photoelectric converting elements; and a BBD transfer section for outputting the signals photoelectrically converted by corresponding photoelectric converting elements by arrangement in time series thereof; said BBD section being constituted of a number of transistors and a number of capacitors; and said photoelectric converting elements and the transistors constituting said BBD transfer section being constituted of thin semicondutor films.

A still further object of the present invention is to provide a photoelectric converter in solid-state assembly, comprising the folloiwng sections juxtaposed integrally on the same substrate;

a photoelectric converting section constituted of a number of photoelectric converting elements arranged in an array, each element having a light-receiving surface for input of light-information and having a diode structure; a transistor section for transfer constituted of a number of transistors for transfer, each being provided for each of said photoelectric converting elements, to perform switching operation for transfer of the signals photoelectrically converted by corresponding photoelectric converting elements; and a BBD transfer section for outputting the signals transferred from each photoelectric converting element by arrangement in time series thereof, said BBD section being constituted of a number of transistors and a number of capacitors; and said photoelectric converting elements, said transistors for transfer and the transistors constituting said BBD transfer section being constituted of thin semiconductor films.

BRIEF DESCRIPTION OF THE DRAWINGS

FIG. 5A is a schematic plan view for illustrating the converter of FIG. 4;

FIG. 5B is a cross-sectional view taken along a line A—A in FIG. 5A;

DESCRIPTION OF THE PREFERRED EMBODIMENTS

Figure 1:
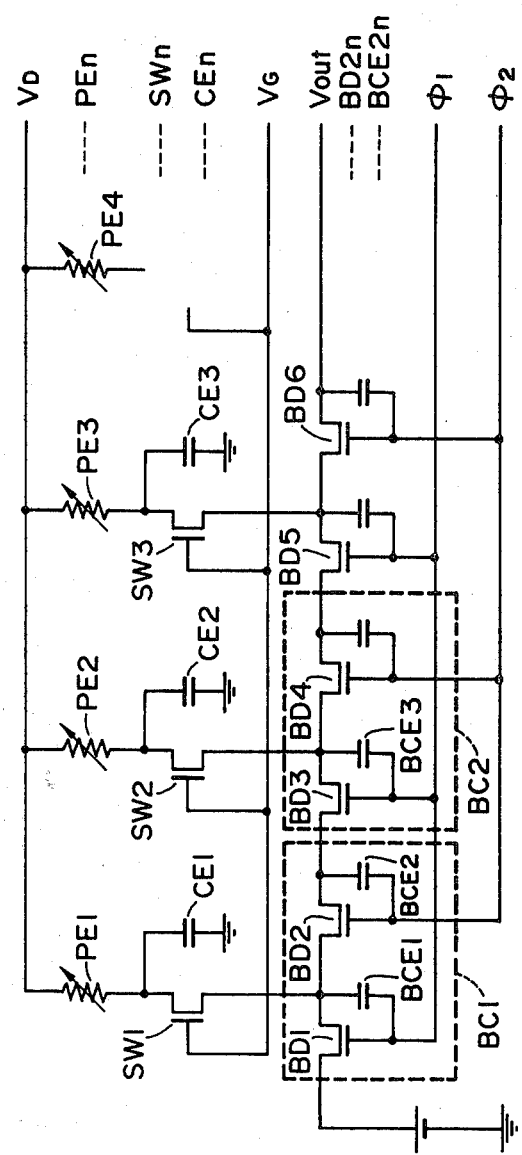
FIG. 1 is a circuit diagram of a photoelectric converter which is the first embodiment of this invention.

FIG. 1 shows a diagram for illustrating an electric circuit in a photoelectric converter which is the first embodiment of this invention.

The photoelectric converter shown in FIG. 1 comprises a photoelectric converter section constituted of photoelectric converting elements PE(PE1, PE2-,-,PEn) of n in number which are arranged in an array, a transfer transistor section constituted of transfer transistors SW(SW1, SW2,-,SWn) of n in number which are provided for each of said photoelectric converting elements PE, a charge accumulating capacitor section constituted of capacitors CE(CE1, CE2,-,CEn) of n in number, and a signal processing section including a bucket brigade device (BBD) for transfer which is constituted of transistors BD and capacitors BCE, these transistors and capacitors being made of semiconductor film.

More particularly, the photoelectric converter comprises the photoelectric converting elements PE of n in number which are arranged in an array of an equal pitch, the charge accumulating capacitors CE of n in number which are mounted on the same substrate integrally with the corresponding photoelectric converting elements PE and connected directly with the respective photoelectric converting elements PE in series to accumulate signal charges corresponding to light-inputs, the switching transistors SW(SW1, SW2,-,SWn) of n in number for performing the switching function to transfer the signals accumulated in the accumulating capacitors CE to the transfer BBD section, and the transfer BBD section constituted of film-like transistors (BD1, BD2, BD3, BD4,-, BD2n) of 2n in number and capacitors BCE (BCE1, BCE2, BCE3, BCE4,-, BCE2n) of 2n in number for outputting the signals transferred from each of said accumulating capacitors CE in time series.

The transfer BBD includes BBD cells BC of n in number which are connected with one another in series, each of the BBD cells being constituted of two transistors BD and two capacitors BCE which are connected alternately with one another. For example, in the first BBD cell BC1, the drain of the transistor BD1 is connected with the source of the transistor BD2, the drain-source connection being connected with one electrode of the capacitor BCE1. The other electrode of the capacitor BCE1 is connected with the gate of the transistor BD1. The capacitor BCE2 has one electrode connected with the gate of the transistor BD2 and the other electrode connected with the drain of the transistor BD2 which is in turn connected with the source of the transistor BD3 in the adjacent BBD cell BC2.

Thus, the BBD cells BD of n in number are connected in series so that the signal transferred to each BBD cell will be successively transferred to the adjoining BBD cell on the right upon inputting BBD driving signals $\phi_1$ and $\phi_2$, and then outputted from the terminal Vout in time series.

Briefly describing the signal processing in the photoelectric converter having the circuit shown in FIG. 1, an information signal obtained in each of the photoelectric converting elements PE by the photoelectric conversion under each light input is simultaneously accumulated in the corresponding accumulating capacitor CE. Thereafter, voltage signal is applied to the gate terminal $V_G$ of the transferring and switching film transistors SW (SW1, SW2,-, SWn) to transfer the signal accumulated in each accumulating capacitor CE to each of the corresponding capacitors (BCE1, BCE3,-, BCE(2n−1)) in the transfer BBD at the same time.

The odd- and even-numbered thin-film transistors (BD1, BD3,-, BD(2n−1) and (BD2, BD4,-, BD2n) are alternately driven by the signals, so that the signals inputted to the capacitors (BCE1, BCE3,-, BCE(2n−1)) will be successively transferred to the adjoining BBD cells on the right for outputting from the terminal Vout in time series.

Basically, each of the photoelectric converting elements PE comprises a transparent electrode located at the side of the light-receiving surface, another electrode disposed at a position opposed to the transparent electrode, and a photoreceptor layer interposed between these electrodes.

The photoreceptor layer constituting the photoelectric converting element PE may be composed of a highly sensitive photoconductive material capable of being formed into a thin film, such as amorphous hydrogenated silicon (hereinafter referred to as a-Si:H), PbO, CdSe, Sb$_2$S$_3$, Se, Se-Te, Se-Te-As, Se-Bi, ZnCdTe, CdS, Cu$_2$S, amorphous hydrogenated germanium (hereinafter referred to as a-Ge:H), amorphous hydrogenated germanium silicon (hereinafter referred to as a-Ge$_x$Si$_{(1-x)}$:H). In the present invention, the layer thickness of the photoreceptor layer is determined depending on the degree of absorption of photo-carriers generated by incidence of light-information thereon, but it is generally 4000 Å to 2$\mu$, preferably 6000 Å to 1.5$\mu$. In the present invention, the photoreceptor layer may preferably be constituted of a-Si:H in view of the advantage that it can be made either n-type or p-type by doping with an impurity of an element of the group V-A in the periodic table such as N, P, As, Sb, Bi, etc. or an element of the group III-A in the periodic table such as B, Al, Ga, In, Tl, etc. As the semi-conductor layer constituting the thin film transistor SW for switching or the thin film transistor BD for transfer BBD, there may be employed, for example, a-Si:H, a-Ge:H, a-Ge$_x$Si$_{(1-x)}$:H, polycrystalline silicon, CdS, CdSe, Cd-S-Se, etc.

In accordance with the present invention, it is preferred to use a semi-conductor layer formed of a-Si:H or polycrystalline silicon from the standpoint of the advantages that resistance can be controlled by doping with impurities and that it can be integrated with the photoelectric converting elements on the same substrate.

In the present invention, the layer thickness of the semiconductor layer constituting the thin film transistor may be suitably within the range from 4000 A to 1.5$\mu$ in view of the depth of expansion of the void layer formed in the semiconductor layer.

As the substrate, on which the photoelectric converting section and the signal processing circuit section are formed, there may be adopted a transparent material, for example, when light-information enters the light-receiving surface of the photoelectric converting section from the side of the substrate. But there is no such limitation of the substrate, when light-information enters from the light-receiving surface formed on the opposite side of the substrate.

The materials to be suitably used for the substrate in the present invention may include a number of commercially available ones, so long as they are excellent in flatness, surface smoothness, heat resistance as well as resistance to chemicals during preparation. Typical examples of such substrate forming materials are glasses, glass No. 7059 (produced by Dow Corning, Co.), magnesia, beryllia, spinel, ittrium oxide or other transparent materials, aluminum, molybdenum, special stainless steel (SuS according to Japanese Industrial Standard), tantalum or other non-transparent metallic materials.

For illustration of the specific feature of the photoelectric converter of the present invention as described above, typical structures are to be described in detail below about the photoelectric converting section, the capacitor section for charge accumulation connected thereto, the switching thin film transistor section for transfer, and the transfer BBD section.

Figure 2A:
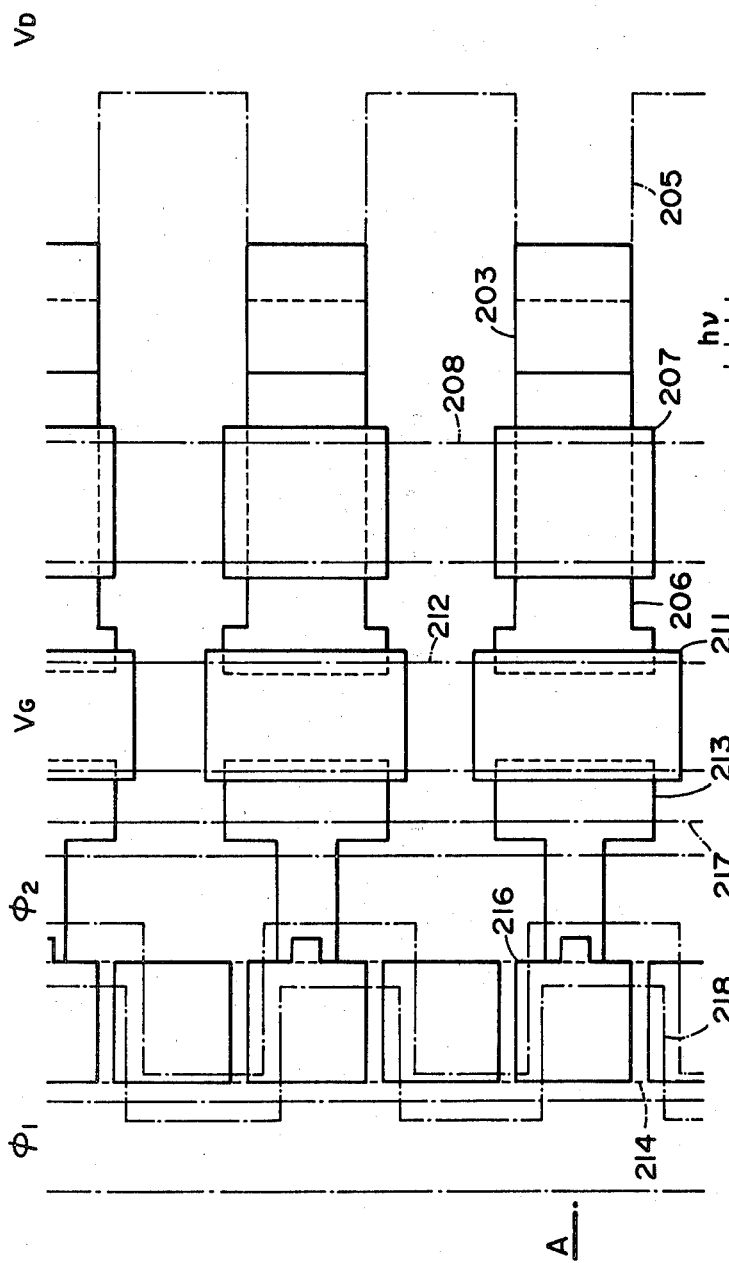
FIG. 2A is a schematic plan view for illustrating the converter of FIG. 1.
Figure 2B:
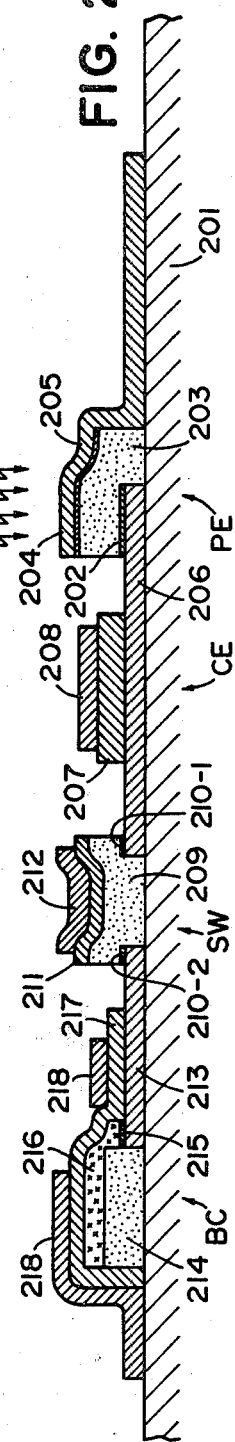
FIG. 2B is a cross-sectional view taken along a line A—A in FIG. 2A.

FIGS. 2A and 2B show the main portion of a preferred embodiment of this invention which comprises a photoelectric converting section, a capacitor section for accumulating electric charges, a transferring and switching transistor section in the form of thin film, and a BBD section for transferring signals.

The photoelectric converting section is provided with ohmic contact layers 202 formed on the surfaces of electrode areas 206 of n in number which are formed on a substrate 201 in an array. Each of the ohmic contact layers can be formed of a-Si:H subjected to doping with a dopant of such a material as P, or the like on the electrode surface. The ohmic contact layer 202 is covered by a photoreceptor layer 203 of non-doped a-Si:H on which a similar ohmic contact layer 204 is formed. Further, on upper electrode 205 is formed on the ohmic contact layer 204.

In this invention, light is inputted from the opposite side to the substrate 201. Accordingly, the electrode 205 is made of a transparent material such as ITO, SnO$_2$, In$_2$O$_3$ or the like.

Photoelectric converting elements PE are connected with capacitors CE through electrodes 206. Each of the capacitors comprises an insulating layer 207 formed on the corresponding electrode 206 and a common electrode 208 grounded thereon. The insulating layer 207 can be made of such a material as silicon nitride or silicon oxide in such a manner that it has a desired capacity with any suitable thickness of film.

Each of transferring and switching thin-film transistors SW, which is connected with the corresponding photoelectric converting element PE, includes a source electrode which is one end of the electrode 206 and a drain electrode which is one end of an electrode 213, and further comprises ohmic contact layers 210-1 and 210-2 formed between the respective electrodes and a film-like semiconductor layer 209, an insulating layer 211 formed on the semiconductor layer 209, and a gate electrode 212 formed on the insulating layer 211. The insulating layer can be made of such a material as silicon nitride or silicon oxide.

The BBD section comprises a semiconductor layer 214 formed on the substrate 201 and source-drain layers 216 formed alternately on the semiconductor layer 214 through ohmic contact layers 215. The BBD section is connected with the transferring and switching transistors SW through the electrodes 213. The BBD section further comprises an insulating layer 217 of such a material as silicon nitride or silicon oxide laminated on the source-drain layers 216 and upper gate electrodes 218.

The BBD is designed such that signals $\phi_1$ and $\phi_2$ are alternately applied to the semiconductor layers and source-drain layers through the common gate electrode 218-1 and 218-2 of the thin-film transistors. Each of the transferring and switching transistors SW includes a gate electrode 212 which is connected with the gate electrodes 212 of the other transistors SW. The electrode 205 of each photoelectric converting element PE is connected with the electrodes 205 of the other elements.

For obtaining or sending signals, a specific electrode is connected with the source-drain layer of the last BBD cell through a contact hole which is formed through the insulating layer thereof.

Figure 3A:
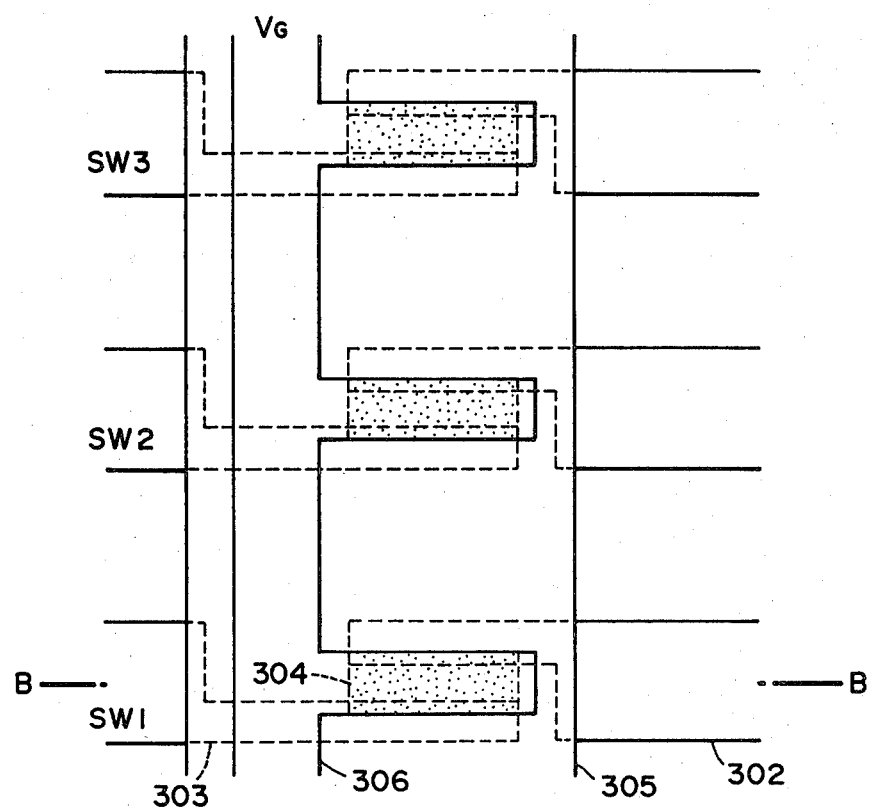
FIG. 3A is a schematic plan view of a modification of the first embodiment.
Figure 3B:
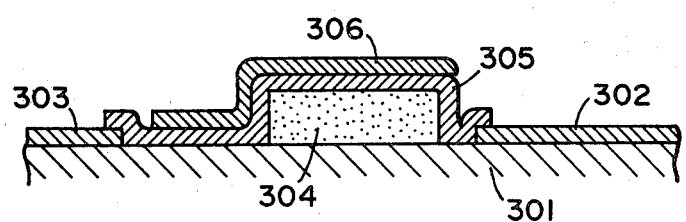
FIG. 3B is a cross-sectional view taken along a line B—B in FIG. 3A.

FIGS. 3A and 3B show a preferred embodiment of this invention which has a larger ratio of W/L, that is, channel width/channel length in the transferring and switching film transistor SW. As shown in FIG. 3A, an insulating layer 305 is formed on a semiconductor layer 304 which is formed on electrodes 302 in ohmic contact, and a gate electrode 306 is formed on the layer 305. A channel is defined parallel to a common line $V_G$ of gate electrodes 306. Therefore, the ratio W/L can be increased in comparison with the embodiment of FIG. 2 and at the same time the overlapped area between the electrodes 302, 303 and gate electrode 306 can be decreased to provide a smaller parasitic capacity.

Figure 4:
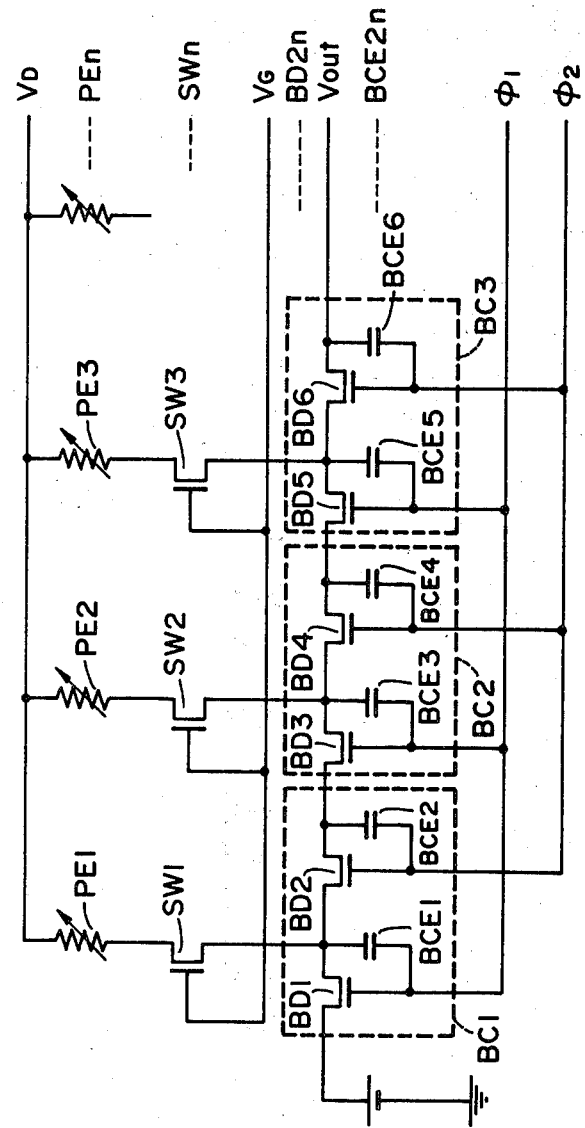
FIG. 4 is a circuit diagram of a photoelectric converter which is the second embodiment of this invention.

FIG. 4 shows a circuit diagram used in the second embodiment of this invention. A photoelectric converter in FIG. 4 comprises a photoelectric converting section constituted of photoelectric converting elements PE of n in number which are arranged in an array, a transfer transistor section constituted of film-like switching transistors SW of n in number which are provided for each of the photoelectric converting elements PE, and a signal processing section including a transferring BBD for fetching signals transferred from the photoelectric converting section in time series. More particularly, the transfer transistor section includes transferring and switching film transistors SW for transferring signals to the transfer BBD section in response to light-information, these transistors being mounted on the substrate integrally with and connected in series with the respective photoelectric converting elements PE which are arranged in an array at a regular pitch. The BBD section includes film transistors BD and capacitors BCE which are respectively 2n in number and adapted to output signals in time series.

Information signals photoelectrically converted in the respective photoelectric converting elements PE in response to light-inputs are transferred to the capacitors BCE in the transfer BBD section when a voltage signal is applied to the common gate $V_G$ of the respective transferring and switching film transistors SW. The signals inputted to the capacitors BCE are forwarded seccessively from the terminal Vout as signals $\phi_1$ and $\phi_2$ are applied to the transferring gates of the respective film transistors BD. Namely, when the signals $\phi_1$ and $\phi_2$ are alternately applied to the gates in such a manner that the signal $\phi_1$ is applied to the gate of an odd-numbered film transistor BD with the other signal $\phi_2$ to the gate of a even-numbered film transistor BD, the signals transferred to the respective photoelectric converting elements PE are outputted from the terminal Vout in time series. Such an operation is repeated to output the photoelectrically converted signals successively.

Each of the photoelectric converting elements PE in the second embodiment also includes a photoreceptor layer which is made of the same material as in the first embodiment. The switching film transistors SW and the film transistors BD for constituting the transfer BBD also includes semiconductor layers which are made of the same material as in the first embodiment.

FIGS. 5A and 5B show the main part of the photoelectric converter which uses the circuit shown in FIG. 4, said main part including a photoelectric converting section, a transferring and switching film transistor section and a BBD section.

The photoelectric converting section comprises an ohmic contact layer 503 formed on the right-hand area surfaces of electrodes 502 which are arranged on a substrate 501 in an array by n in number photoreceptor layers 504 formed on the ohmic contact layer 503, an ohmic contact layer 505 similar to the layer 503 which is formed on the photoreceptor layer 504, and upper electrodes 506 formed on the ohmic contact layer 505. In the embodiment shown in FIGS. 5A and 5B, the electrodes 506 are made of a transparent material such as ITO, $In_2O_3$, $SnO_2$ or the like since any light is inputted from the opposite side to the substrate.

The photoelectric converting elements PE are connected through the electrodes 502 with the respective transferring and switching film transistors SW each of which has a source electrode as part of the electrode 502, a drain electrode as part of the electrode 511, semiconductor layers 508, ohmic contact layers 507 interposed between the semiconductor layers 508 and the respective electrodes 502 and 511, insulating layers 509 formed on the respective semiconductor layers 508, and gate electrodes 510 formed on the insulating layers 509. The insulating layers can be made of such a material as silicon nitride, silicon oxide or the like.

The BBD cell BC includes semiconductor layers 512 formed on the substrate 501, source-drain layers 514 formed on the semiconductor layers 512, insulating layers 513, and gate electrodes 516-1 and 516-2 formed on the respective insulating layers 513 in a laminated assembly. The source-drain layers 514 are alternately joined electrically to the respective electrodes 511 through the ohmic contact layers 513 and also connected with the respective transferring and switching film transistors SW.

Figure 6:
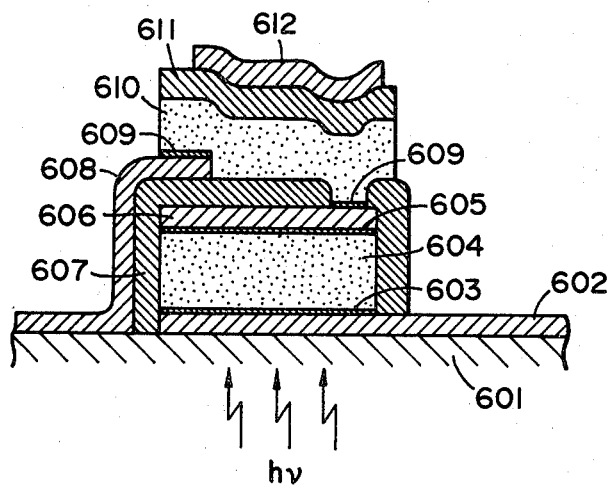
FIG. 6 is a schematic cross-section of a modification of the second embodiment.

FIG. 6 is a schematic cross-section of a modification of the second embodiment in which, since light is incident on the substrate 601, a photoelectric converting section and a switching film transistor section are laminated one on another. Consequently, the substrate 601 and electrode 602 are made of a transparent material, and a photoreceptor layer 604 is interposed between ohmic contact layers 603 and 605. The electrode 606 functions as an electrode for a photoelectric converting element and also as a source electrode for a transferring film transistor. The film transistor comprises ohmic contact layers 609, a drain electrode 608, a semiconductor layer 610, an insulating layer 611 and a gate electrode 612. The film transistor also includes an insulating layer 607 for electrically isolating the photoelectric converting element and the film transistor. The insulating layer 611 serves as a layer for isolating the gate and is made of such a material as silicon nitride or silicon oxide. The electrode 606 serves also as a light-shielding film for preventing any light from being incident on the semiconductor layer 610 in the film transistor.

Figure 7:
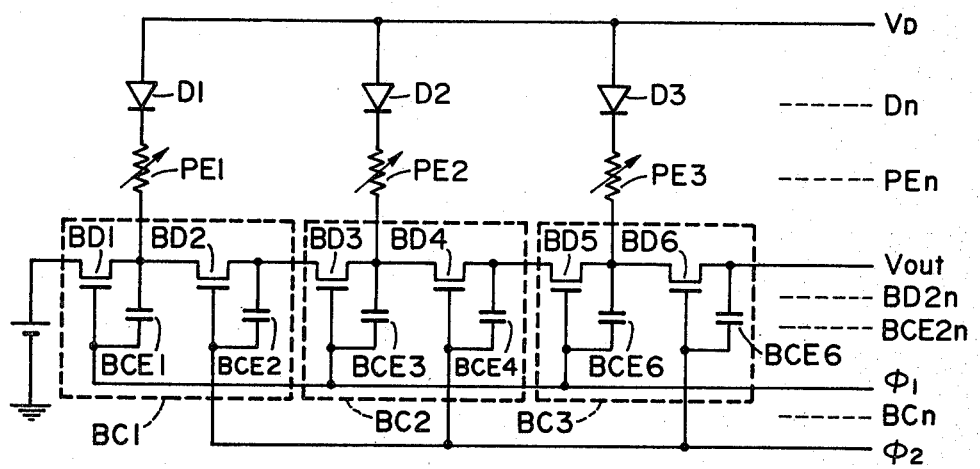
FIG. 7 is a circuit diagram of a photoelectric converter which is the third embodiment of this invention.

FIG. 7 is a circuit diagram used in a photoelectric converter which is the third embodiment of this invention. The photoelectric converter comprises a photoelectric converting section constituted of photoelectric converting element PE of n in number, a charge-blocking diode section constituted of charge-blocking diodes D of the same number which are provided one for each of the photoelectric converting elements PE, and a signal processing section including a charge transferring BBD structure for obtaining signals from the photoelectric converting section in time series. More particularly, the photoelectric converting section comprises photoelectric converting elements PE of n in number which are arranged in an array at a regular pitch. The charge-blocking diode section comprises charge-blocking diodes D of n in number for blocking any signal from the photoelectric converting section to the power line, which diodes are mounted on the substrate integrally with the photoelectric converting section and each connected with the respective photoelectric converting element PE in series. The signal processing section for outputting signals from the photoelectric converting section in time series includes a charge-transferring BBD as shown in FIG. 7 which comprises a number of BBD cells BC, each constituted of two transistors BD and two capacitor BCE. The transistors are formed of a semiconductor film.

Among signals obtained at the photoelectric converting elements PE in response to light inputs, the signals photoelectrically converted at the photoelectric converting elements only during application of voltage signal $V_D$ are inputted to the capacitors BCE in the transferring BBD and also signals $\emptyset_1$ and $\emptyset_2$ are alternately inputted to the transferring BBD so that signals accumulated in the capacitors BCE will be obtained from the terminal Vout in time series.

Figure 8:
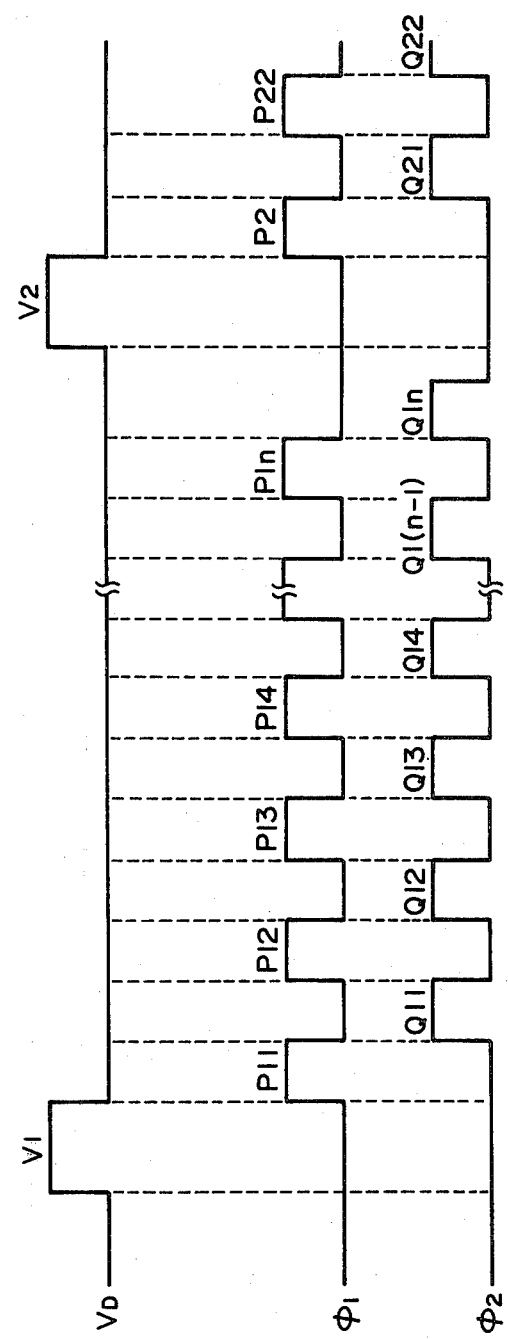
FIG. 8 is a timing chart for input signals in the circuit of FIG. 7.

FIG. 8 shows a timing chart for illustrating input signals from the exterior. When signals are inputted to the respective diodes D from $V_D$ in timing shown by $V_1$ and $V_2$ and light is incident on the light-receiving surface of the photoelectric converting section, the signals are transferred from the photoelectric converting elements PE through the transferring BBD to the terminal Vout through which they are sent to the exterior, only for such a period that the signals $\emptyset_1$ and $\emptyset_2$ are alternately inputted to the transferring BBD, that is, between $P_{11}$ and $P_{1n}$.

The photoreceptor layer constituting the photoelectric converting element PE may be constituted, similarly as in the aforesaid embodiment, of a highly photoconductive material such as a-Si:H, PbO, CdSe, $Sb_2O_3$, Se, Se-Te, Se-Te-As, Se-Bi, ZnCdTe, CdS, $Cu_2S$, a-Ge:H, a-$Ge_xS_{(1-x)}$:H, etc.

The semiconductor layer constituting the thin film transistor for transfer BBD may be constituted of, for example, the aforesaid a-Si:H, a-Ge:H, a-$Ge_xSi_{(1-x)}$:H, polycrystalline silicon, CdS, CdSe, Cd-S-Se, etc.

In the present invention, it is possible to control resistance by way of doping and, for the advantage of enabling integration with the photoelectric converting elements on the same substrate, the semiconductor layer may suitably be formed of a-Si:H or polycrystalline silicon.

The photoelectric converting element and the film transistor for the signal processing section will now be described in more detail in connection with the photoelectric converting apparatus using the circuit shown in FIG. 7 which is the third embodiment of this invention.

Figure 9A:
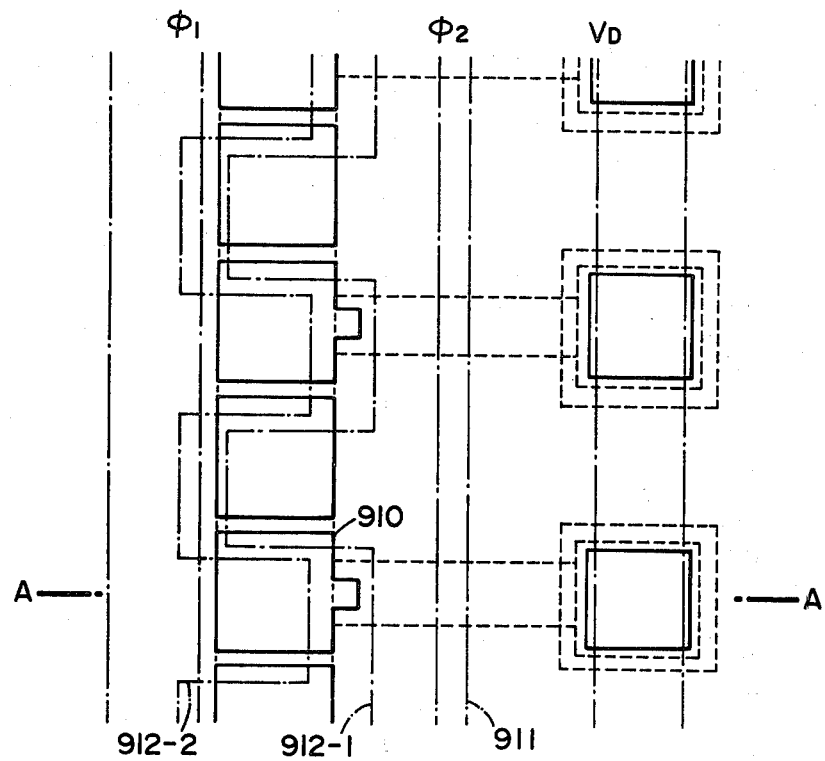
FIG. 9A is a plan view for illustrating the apparatus represented by the circuit of FIG. 7.
Figure 9B:
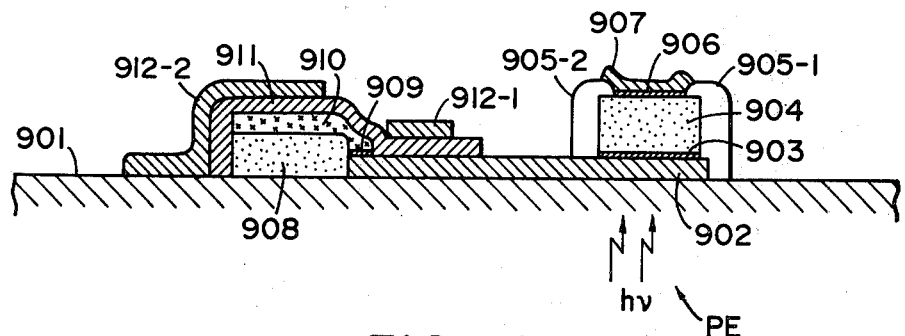
FIG. 9B is a cross-sectional view taken along a line A—A in FIG. 9A.

FIGS. 9A and 9B show the main part of a preferred embodiment of this invention which comprises photoelectric converting elements and film transistors and capacitors constituting the transferring BBD. Each of the photoelectric converting elements PE includes a photoreceptor layer made of a-Si:H. Typically, the photoelectric converter shown in FIG. 9 comprises Schottky junction type diodes for a charge blocking diode D.

Each of the photoelectric converting elements PE comprises an ohmic contact layer 903 made of a-Si:H subjected to doping with a dopant such as P or As on the surface of each of electrode areas 902 which are arranged in an array on a substrate 901, and a photoreceptor layer 904 of non-doped a-Si:H formed on the ohmic contact layer. An electrode 906 of such a material as Pt, Rh, Pd or others is formed on the photoreceptor layer 904 to function as a charge-blocking diode section. The electrode 906 provides a Schottky barrier together with the photoreceptor layer 904 and is connected with an electrode 907 in a common power line. Preferably, the insulating layers 905-1 and 905-2 are formed of such a material as silicon nitride or silicon oxide for protecting and insulating the Schottky barrier portion. In the embodiment shown in FIG. 9, light is inputted from the side of a substrate 901. Accordingly, the substrate 901 is made of any transparent material and the electrode 902 also is formed of such a material as ITO, $SnO_2$ or $In_2O_3$.

Each of the thin-film transistors BD constituting the transferring BBD cell BC includes a semiconductor layer 908 formed on the substrate 901, a source-drain layer 910 formed on the semiconductor layer 908, an insulating layer 911 of such a material as silicon nitride or silicon oxide which is formed on the source-drain layer 910, and upper transferring gate electrodes 912 formed on the insulating layer 911. All of the source-drain layers 910 in the BBD cell BC are alternately connected with the respective photoelectric converting elements through the ohmic contact layers 909 and electrodes 902. The gate electrodes 912 are placed respectively on the semiconductor layer 908 and the source-drain layer 910. A source of power is connected with the common electrode 907. A signal fetching electrode is connected with the source-drain layer through a contact hole which is formed through the insulating layer on the source-drain layer in the last BBD cell BC.

Figure 10:
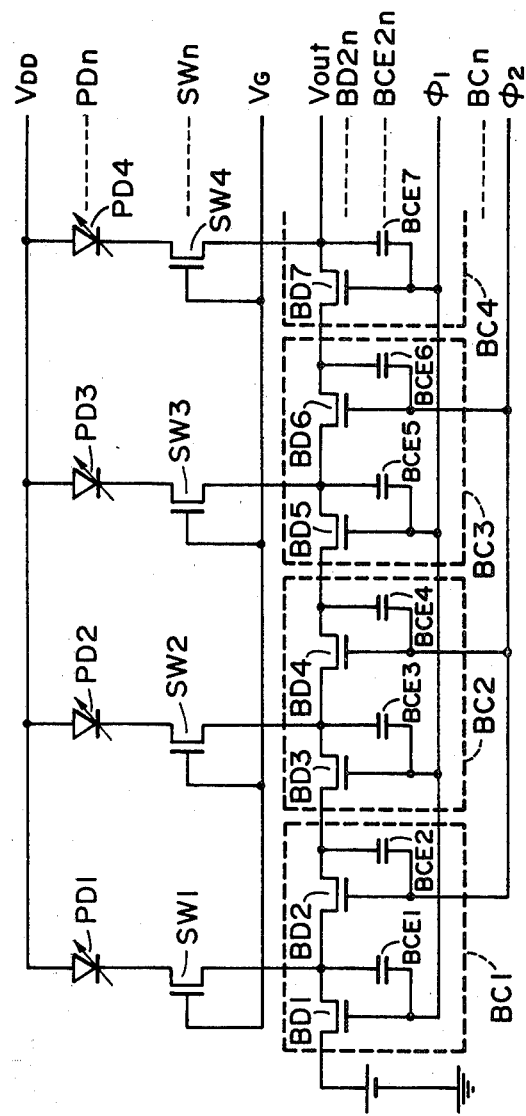
FIG. 10 is a circuit diagram of a photoelectric converter which is the fourth embodiment of this invention.

FIG. 10 shows a circuit diagram used in a photoelectric converter which is the fourth embodiment of this invention. The photoelectric converter of FIG. 10 comprises a photoelectric converting section constituted of photoelectric converting elements PD of n in number in the form of photodiode, and a signal processing section constituted of transferring and switching transistors SW of n in number which are connected with the respective photoelectric converting elements PD and a transfer BBD. These components are mounted integrally on the same substrate into a solid-state assembly. More particularly, in the photoelectric converter using the circuit shown in FIG. 10, the photoelectric converting section includes photoelectric diodes PD of n in number which are arranged in an array at a regular pitch. The switching film transistors SW for transferring signals from the photoelectric converting section to the BBD transferring section are mounted on the same substrate integrally with the connected with the respective photoelectric converting diodes PD in series. The transferring BBD for outputting the photoelectrically converted signals in time series comprises film-like transistors BD and capacitors BCE.

Signals outputted from the respective photoelectric converting diodes PD in response to light-inputs are transferred simultaneously to the respective capacitors BCE in the BBD transferring section by applying a voltage signal $V_G$ to the gates of the switching film transistors SW. Subsequently, signals $\phi_1$ and $\phi_2$ are alternately inputted to the BBD transferring section so that all of the signals photoelectrically converted in the respective photoelectric converting diodes (PD1, PD2 . . . , PDn) will be transmitted through the terminal Vout in time series. Such an operation is repeated so that signals can be read out in response to light-input signals.

The photoelectric diodes PD can be classified, for example, into the three types of diodes as shown below, and they are constituted of photoconductive materials suitably selected:

(1) Homo-junction type

Photoreceptor layer is formed, using a photoconductive material such as a-Si:H, a-Ge:H, a-Ge$_x$Si$_{(1-x)}$:H, polycrystalline silicon, etc.

(2) Hetero-junction type

Photoreceptor layer is constituted of a combination of a-Si:H, a-Ge:H or a-Ge$_x$Si$_{(1-x)}$:H with SnO$_2$, ITO, In$_2$O$_3$, etc. It is also possible to use a combination of the above constitution with PbO, CdSe, Sb$_2$S$_3$, Se, Se-Te, Se-Te-As, Se-Bi, ZnCdTe, CdS, Cu$_2$S or a combination of two species selected from these.

(3) Schottky-junction type

Photoreceptor layer is constituted of a combination of a-Si:H, a-Ge:H, a-Ge$_x$Si$_{(1-x)}$:H, polycrystalline silicon with Pd, Pt, Rh, Ir, Au, etc. for forming Schottky barrier.

In this embodiment, the layer thickness of the photoreceptor constituting the photoelectric converting diode PD is determined depending on the degree of absorption of photocarriers generated by incidence of light-information thereon, but it is generally 4000 Å to 2$\mu$, preferably 6000 Å to 1.5$\mu$. In this embodiment, the photoreceptor layer may preferably be constituted of a-Si:H in view of easy selection of Schottky electrode materials as well as the advantage that it can be made either n-type or p-type by doping as impurity of an element of the group V-A in the periodic table such as P, As or Sb, or an element of the group III-A in the periodic table such as B, Al or Ga.

As the material for forming the semiconductor layer constituting the thin film transistor SW for switching or the thin film transistor BD for BBD for transfer, there may be employed, for example, a-Si:H, a-Ge:H, a-Ge$_x$-Si$_{(1-x)}$:H, polycrystalline silicon, CdS, CdSe, Cd-S-Se, etc.

In this embodiment, it is preferred to use a semiconductor layer formed of a-Si:H or polycrystalline silicon from standpoint of the advantages that resistance can be controlled by doping with impurities and that it can be integrated with the photoelectric converting elements on the same substrate.

In this embodiment, the layer thickness of the semiconductor layer constituting the thin film transistor may suitably within the range from 4000 Å to 1.5$\mu$ in view of the depth of expansion of the void layer formed in the semiconductor layer.

As the substrate, on which the photoelectric converting section and the signal processing circuit section are formed, there may be adopted a transparent material, for example, when light-information enters the light-receiving surface of the photoelectric converting photodiode section from the side of the substrate. But there is no such limitation of the substrate, when light-information enters from the light-receiving surface formed on the opposite side of the substrate for the photoelectric converting photodiode.

The materials to be suitably used for the substrate in the present invention for this embodiment may include a number of commercially available ones, so long as they are excellent in flatness, surface smoothness, heat resistance as well as resistance to chemicals during preparation. Typical examples of such substrate forming materials are glasses, glass No. 7059 (produced by Dow Corning, Co.), magnesia, beryllia, spinel, ittrium oxide or other transparent materials, aluminum, molybdenum, special stainless steel (SuS according to Japanese Industrial Standard), tantalum or other non-transparent metallic materials.

Referring now to the fourth embodiment of the photoelectric converter device along with the above description, typical examples of concrete structures of the three sections, namely the photoelectric converting section, the diode section and the thin film transistor section for transfer BBD, are to be illustrated in detail.

Figure 11A:
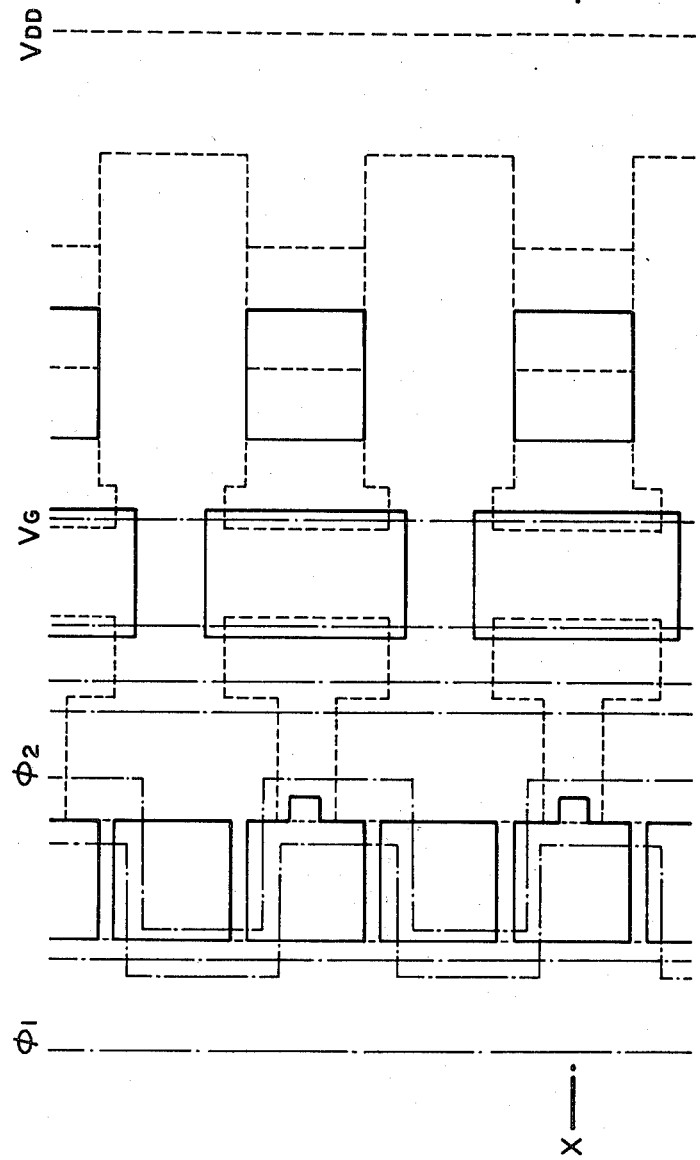
FIG. 11A is a plan view for illustrating the photoelectric converter of FIG. 10.
Figure 11B:
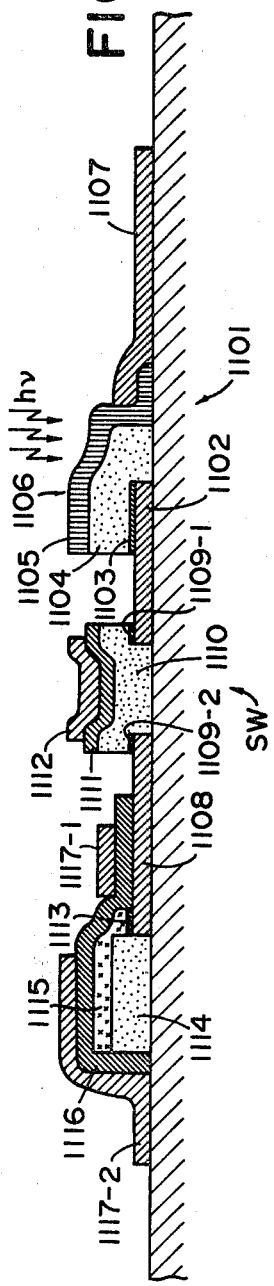
FIG. 11B is a cross-sectional view taken along a line X—X in FIG. 11A.

FIGS. 11A and 11B show schematically the photoelectric converting photodiode section and the BBD transfer section, respectively, which are the principal parts of the fourth embodiment, the former being a schematic plan view and the latter a cross-sectional view of FIG. 11A taken along a line XX.

In FIGS. 11A and 11B, there is shown an example wherein Schottky-junction type is employed for the photoelectric converting photodiode section.

The photoelectric converting diode 1106 is formed by providing an ohmic contact layer 1103 on the surface of an area of electrodes of n in number formed in an array on an substrate 1101, then a photoreceptor layer 1104 on said ohmic contact layer and further an electrode area 1105 thereon.

The electrode area 1105 forms a Schottky junction with the photoreceptor layer 1104.

In this type of photoelectric converting diode seciton 1106, light-information enters through the electrode 1106, and therefore the electrode area 1105 is formed of a transparent material.

The thin film transistor for transfer SW connected directly with the photoelectric converting diode section 1106 has a structure, comprising a source electrode 1102, which is also used as an electrode for direct connection, and a drain electrode 1108 provided on the substrate 1101, an ohmic contact layer 1109 laminated on said electrodes, followed by lamination of a semiconductor layer 1110 thereon and then by provision of an insulating layer 1111, and further a gate electrode 1112 common to each of the thin film transistors provided thereon.

As a material for forming the insulating layer 1111, there may be employed an insulating material such as silicon nitride and silicon oxide.

The thin film transistor BD, constituting the BBD transfer section directly connected with the thin film transistor for transfer SW, has a directly connected electrode 1108 provided on the substrate 1101, a semiconductor layer 1114 and a source-drain layer 1115 laminated on the semiconductor layer 1114, an insulating layer 1116 laminated on said layer 1115 and a gate electrode 1117 provided on the insulating layer 1116. There is also provided an ohmic contact layer 1113 between the electrode 1108 and the drain layer 1115.

As shown in the plan view of FIG. 11A, the gate electrodes 1117-1 and 1117-2 are provided so as to be overlapped alternately on the semiconductor layer 1114 and the source-drain layer. There is also provided a common electrode 1107 for each of the photoelectric converting diodes connected to the common power source line $V_{DD}$.

Figure 12:
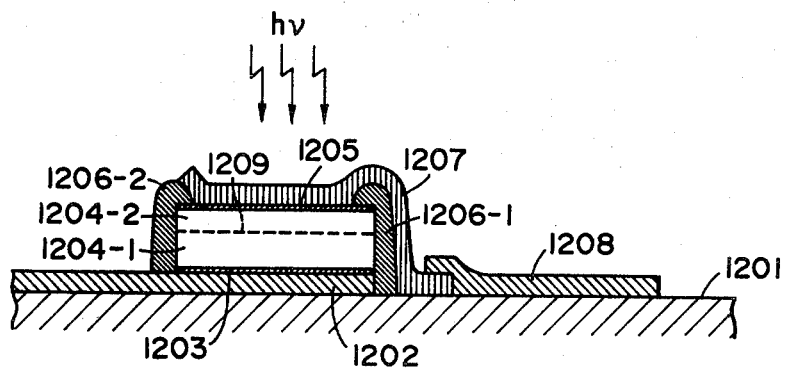
FIG. 12 is a cross-sectional view of a modification of the fourth embodiment shown in FIG. 10.

FIG. 12 shows a schematic cross-sectional view of an example, in which a p-n homo-junction type is used as the photoelectric converting diode. In this example, light-information is permitted to be incident on the side opposite to the substrate. The difference in structure from the type as shown in FIG. 11 resides in that there is provided an ohmic layer 1203 between the substrate 1201 and the transparent electrode 1208 and also in that there is provided an insulating layer 1206 to protect p-n homo-junction 1209 for electrical insulation. Namely, the photoelectric converting diode as shown in FIG. 12 is constituted of an ohmic contact layer 1203 formed on an electrode 1202 provided on the substrate 1201, a p-type or n-type semiconductor layer 1204-1 and a semiconductor layer 1204-2 having a conductivity of opposite polarity to the semiconductor layer 1204-1 provided on said ohmic contact layer to constitute a photoreceptor layer, an ohmic contact layer 1205 provided on said semiconductor layer 1204-2, a transparent electrode 1207 provided thereon, and light-shielding electrical insulating layers 1206-1 and 1206-2 to protect the photoreceptor layer and avoid light incidence on the sites other than the light-receiving surface, said electrode 1207 being connected electrically to a connection electrode 1208. There is also formed a p-n junction 1209 between the semiconductor layers 1204-1 and 1204-2.

The photoreceptor layer can be formed by, for example, laminating a n-type a-Si:H layer subjected to doping with P or As on a p-type a-Si:H subjected to doping with B. When using a-Si:H, the p-layer for forming the junction is doped with B.

Figure 13:
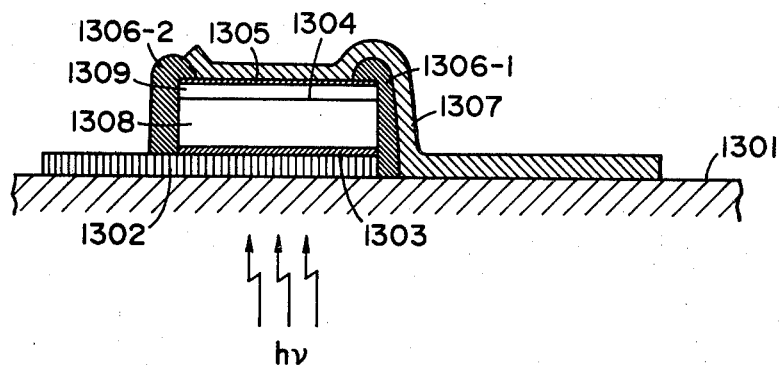
FIG. 13 is a cross-sectional view of another modification of the fourth embodiment.

FIG. 13 shows an example of a photoelectric converting diode of the hetero-junction type, wherein light-information is to be permitted to be incident on the side of the substrate.

The photoelectric converting diode is formed by providing a transparent electrode 1302 on the substrate 1301, an ohmic contact layer 1303 on said electrode, followed successively by lamination of different semiconductor layers 1308 and 1309 to provide a heterojunction layer 1304 and forming an ohmic contact layer 1305 on the layer 1309 and further providing an electrode 1307 thereon. When either one of the semiconductor layer 1308 and 1309 is formed of a-Si:H, the other semiconductor should be formed of ITO, $SnO_2$ or $In_2O_3$.

There are also provided the protective insulating layers 1306-1 and 1306-2 in the case of FIG. 13, similarly as in the case of FIG. 12.

What we claimed is:

1. A photoelectric converter in solid-state assembly, comprising the following sections juxtaposed integrally on the same substrate:
    a photoelectric converting section constituted of a number of photoelectric converting elements arranged in an array, each element having a light-receiving surface for input of light-information;
    a charge accumulating section constituted of a number of accumulating means, each being provided for each of said photoelectric converting elements, for accumulation of charge signals photoelectrically converted by corresponding photoelectric converting elements;
    a transistor section for transfer constituted of a number of transistors for transfer, each being provided for each of said accumulating means, perform a switching operation for transfer of the signals accumulated in corresponding accumulating means; and
    a BBD transfer section for outputting the signals transferred from each of said accumulating means by arrangement in time series thereof, wherein; said BBD section includes a number of transistors and a number of capacitors; and said photoelectric converting elements, said transistors for transfer and the transistors constituting said BBD transfer section includes thin semiconductor films.

2. A photoelectric converter in solid-state assembly according to claim 1, in which said thin semiconductor film includes hydrogenated amorphous silicon.

3. A photoelectric converter in solid-state assembly according to claim 1, in which said thin semiconductor film includes polycrystalline silicon.

4. A photoelectric converter in solid-state assembly, comprising the following sections juxtaposed integrally on the same substrate:
    a photoelectric converting section constituted of a number of photoelectric converting elements arranged in array, each element having a light-receiving surface for input of light-information;
    a transistor section for transfer constituted of a number of transistors, each being porvided for each of said photoelectric converting elements, to perform a switching operation for transfer of charge signals photoelectrically converted by corresponding photoelectric converting elements; and
    a BBD transfer section for outputting the signals transferred from each photoelectric converting element by arrangement in time series thereof, wherein; said BBD section includes a number of transistors and a number of capacitors; and said photoelectric converting elements, said transistors for transfer and the transistors constituting said BBD transfer section includes thin semiconductor films.

5. A photoelectric converter in solid-state assembly according to claim 4, in which said thin semiconductor film includes hydrogenated amorphous silicon.

6. A photoelectric converter in solid-state assembly according to claim 4, in which said thin semiconductor film includes polycrystalline silicon.

7. A photoelectric converter in solid-state assembly, comprising the following sections juxtaposed integrally on the same substrate:
    a photoelectric converting section constituted of a number of photoelectric converting elements arranged in an array, each element having a light-receiving surface for input of light-information;

a diode section constituted of a number of diodes, each being provided for each of said photoelectric converting elements; and a BBD transfer section for outputting the signals photoelectrically converted by corresponding photoelectric converting elements by arrangement in time series thereof, wherein; said BBD section includes a number of transistors and a number of capacitors; and said photoelectric converting elements and the transistors constituting said BBD transfer section includes thin semiconductor films.

8. A photoelectric converter in solid-state assembly according to claim 7, in which said thin semiconductor film includes hydrogenated amorphous silicon.

9. A photoelectric converter in solid-state assembly according to claim 7, in which said thin semiconductor film includes polycrystalline silicon.

10. A photoelectric converter in solid-state assembly, comprising the following sections juxtaposed integrally on the same substrate:

a photoelectric converting section constituted of a number of photoelectric converting elements arranged in an array, each element having a light-receiving surface for input of light information and having a diode structure;

a transistor section for transfer constituted of a number of transistors for transfer, each being provided for each of said photoelectric converting elements, to perform a switching operation for transfer of the signals photoelectrically converted by corresponding photoelectric converting elements; and a BBD transfer section for outputting the signals transferred from each photoelectric converting element by arrangement in time series thereof, wherein; said BBD section includes a number of transistors and a number of capacitors; and said photoelectric converting elements, said transistors for transfer and the transistors constituting said BBD transfer section includes thin semiconductor films.

11. A photoelectric converter in solid-state assembly according to claim 10, in which said thin semiconductor film includes hydrogenated amorphous silicon.

12. A photoelectric converter in solid-state assembly according to claim 10, in which said thin semiconductor film includes polycrystalline silicon.

* * * * *

UNITED STATES PATENT AND TRADEMARK OFFICE
CERTIFICATE OF CORRECTION

PATENT NO.   :   4,405,857
DATED        :   September 20, 1983
INVENTOR(S)  :   YUTAKA HIRAI, ET AL.

It is certified that error appears in the above-identified patent and that said Letters Patent is hereby corrected as shown below:

Column 1, line 25, after "and" insert --yet--;
         line 26, after "converters" insert --,--;
         line 27, after "surfaces" delete "involve".
Column 5, line 66, change "4000A" to --4000 $\overset{o}{A}$--.
Column 11, line 50, change "receptor°" to --receptor--.

Signed and Sealed this

Tenth Day of January 1984

[SEAL]

Attest:

GERALD J. MOSSINGHOFF

Attesting Officer    Commissioner of Patents and Trademarks